United States Patent
Fujii et al.

(10) Patent No.: US 9,007,764 B2
(45) Date of Patent: Apr. 14, 2015

(54) ELECTRONIC DEVICE HAVING COOLING UNIT

(71) Applicant: Fujitsu Limited, Kawasaki-shi (JP)

(72) Inventors: Minoru Fujii, Kawasaki (JP); Mitsuaki Hayashi, Kawasaki (JP); Kenji Joko, Yokohama (JP); Osamu Saito, Kawasaki (JP); Wataru Takano, Osaka (JP); Takashi Shirakami, Kawasaki (JP); Kouichi Kuramitsu, Setagaya (JP); Yusuke Kira, Edogawa (JP)

(73) Assignee: Fujitsu Limited, Kawasaki (JP)

( * ) Notice: Subject to any disclaimer, the term of this patent is extended or adjusted under 35 U.S.C. 154(b) by 211 days.

(21) Appl. No.: 13/717,902

(22) Filed: Dec. 18, 2012

(65) Prior Publication Data
US 2013/0170138 A1    Jul. 4, 2013

(30) Foreign Application Priority Data
Dec. 28, 2011    (JP) .................. 2011-288693

(51) Int. Cl.
*H05K 7/20*    (2006.01)

(52) U.S. Cl.
CPC ........ *H05K 7/20145* (2013.01); *H05K 7/20136* (2013.01); *H05K 7/20572* (2013.01)

(58) Field of Classification Search
USPC ......... 361/679.46–679.5, 688–697; 165/80.2, 165/80.3, 104.33, 121–126, 185; 174/50, 174/54, 59, 60, 70 R, 71, 71 R, 168, 173, 174/520; 312/223.2, 223.3, 223.6, 330.1, 312/334.1, 334.5, 334.7, 334.8; 454/184
See application file for complete search history.

(56) References Cited

U.S. PATENT DOCUMENTS

| | | | | |
|---|---|---|---|---|
| 3,868,158 A * | 2/1975 | Laboue | ......................... | 312/350 |
| 3,874,444 A * | 4/1975 | Perce et al. | ..................... | 165/47 |
| 4,758,925 A * | 7/1988 | Obata et al. | .................. | 361/695 |
| 4,931,904 A * | 6/1990 | Yiu | ............................... | 361/695 |
| 5,079,438 A * | 1/1992 | Heung | ......................... | 307/141 |
| 5,402,312 A * | 3/1995 | Kinjo et al. | ........................ | 361/695 |
| 5,995,368 A * | 11/1999 | Lee et al. | ...................... | 361/695 |
| 6,349,031 B1 * | 2/2002 | Lin et al. | .................. | 361/679.33 |
| 6,388,879 B1 * | 5/2002 | Otaguro et al. | ............... | 361/695 |
| 6,421,238 B1 * | 7/2002 | Negishi | ......................... | 361/695 |
| 6,499,609 B2 * | 12/2002 | Patriche et al. | ............... | 211/175 |
| 6,801,428 B2 * | 10/2004 | Smith et al. | ............. | 361/679.48 |
| 6,912,129 B2 * | 6/2005 | Baker et al. | .................... | 361/695 |
| 7,110,256 B2 * | 9/2006 | Hasegawa et al. | ............ | 361/697 |
| 7,126,820 B2 * | 10/2006 | Wei | .............................. | 361/695 |
| 7,173,817 B2 * | 2/2007 | Wei | .......................... | 361/679.48 |

(Continued)

FOREIGN PATENT DOCUMENTS

| | | |
|---|---|---|
| JP | 2001-177281 | 6/2001 |
| JP | 2003-332776 | 11/2003 |
| JP | 2005-109334 | 4/2005 |

*Primary Examiner* — Michail V Datskovskiy
(74) *Attorney, Agent, or Firm* — Staas & Halsey LLP

(57) ABSTRACT

There is provided an electric device configured to cool a plurality of plug-in units, the electric device including a plurality of slots, each slot configured to install a plug-in unit, a first fan configured to create a current of air for cooling the plug-in units, a first plug-in unit installed into a first slot, and a second plug-in unit including a second fan configured to create a current of air for cooling the first plug-in unit, the second plug-in unit being installed into a second slot adjacent to the first slot, arranged to a side of mounting component of the first plug-in unit.

17 Claims, 12 Drawing Sheets

(56) References Cited

U.S. PATENT DOCUMENTS

| | | |
|---|---|---|
| 7,244,178 B2 * | 7/2007 | Ueda et al. .................... 454/184 |
| 7,280,356 B2 * | 10/2007 | Pfahnl et al. .................. 361/695 |
| 7,394,654 B2 * | 7/2008 | Zieman et al. ................. 361/695 |
| 7,408,772 B2 * | 8/2008 | Grady et al. .............. 361/679.48 |
| 7,492,591 B1 * | 2/2009 | Aybay et al. .................. 361/695 |
| 7,804,690 B2 * | 9/2010 | Huang et al. .................. 361/724 |
| 7,826,222 B2 * | 11/2010 | Aybay et al. .................. 361/695 |
| 7,957,133 B2 * | 6/2011 | Zieman et al. ............ 361/679.51 |
| 8,520,385 B2 * | 8/2013 | Chen ............................. 361/695 |
| 2002/0012238 A1 * | 1/2002 | Takahashi et al. ............. 361/796 |

* cited by examiner

ELECTRONIC DEVICE HAVING COOLING UNIT

CROSS-REFERENCE TO RELATED APPLICATION

This application is based upon and claims the benefit of priority of the prior Japanese Patent Application No. 2011-288693, filed on Dec. 28, 2011, the entire contents of which are incorporated herein by reference.

FIELD

The embodiments discussed herein are related to an electronic device having a cooling unit.

BACKGROUND

There are electronic devices including a plurality of slots for installing plug-in units (PIU) such as interface cards and control cards. In this kind of electronic device, an electronic component mounted on the plug-in unit is uniformly cooled by air blown from a blower fan that is provided below the slots (see, for example, Japanese Laid-open Patent Publications Nos. 2005-109334, 2001-177281, and 2003-332776).

With the increasing capabilities of electronic components mounted on plug-in units in recent years, the amount of heat generated by these electronic components tends to increase. Therefore, under the current circumstances, it is difficult to sufficiently cool electronic components that generate large amounts of heat by the above-mentioned method of cooling electronic components mounted on plug-in units.

SUMMARY

According to an aspect of the invention, there is provided an electric device configured to cool a plurality of plug-in units, the electric device including a plurality of slots, each slot configured to install a plug-in unit, a first fan configured to create a current of air for cooling the plug-in units, a first plug-in unit installed into a first slot, and a second plug-in unit including a second fan configured to create a current of air for cooling the first plug-in unit, the second plug-in unit being installed into a second slot adjacent to the first slot, arranged to a side of mounting component of the first plug-in unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, exemplary embodiments of an electronic device including a cooling unit are described in detail.

First Embodiment

Figure 1:
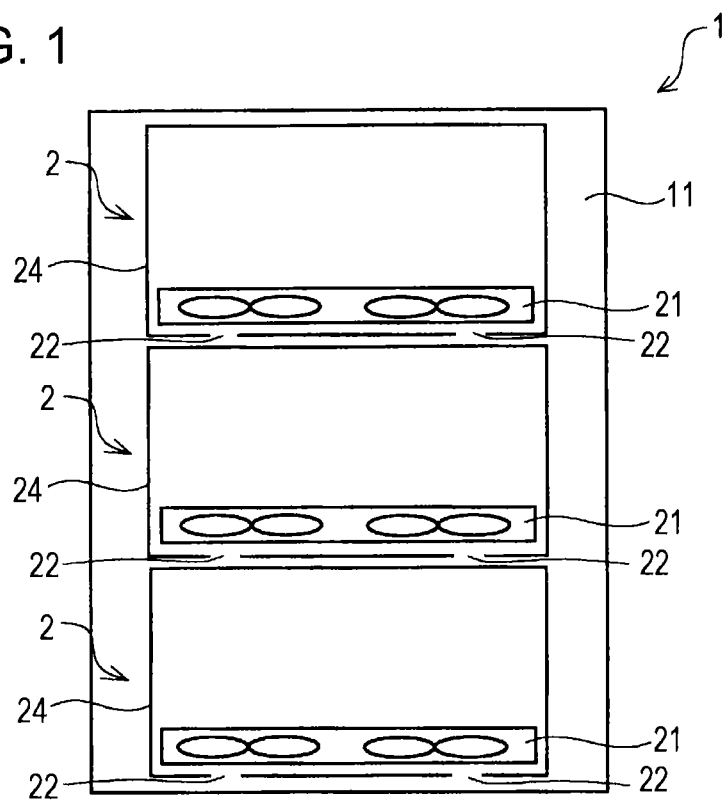
FIG. 1 is a front view of an electronic apparatus according to First embodiment.

FIG. 1 is a front view of an electronic apparatus (e.g., communication apparatus) according to First embodiment. In FIG. 1, the electronic apparatus 1 includes a rack 11 having a plurality of shelves provided in the height direction. An electronic device 2 is provided on each of the shelves of the rack 11. While three levels of electronic devices 2 are staked in the rack 11 in FIG. 1, the number of levels is not particularly limited.

A blower fan (hereinafter, referred to as "device-side fan") 21 is provided in a lower portion of the electronic device 2. The device-side fan is an example of the first fan. The device-side fan 21 cools the inside of the electronic device 2. An inlet opening 22 for taking air (outside air) into the electronic device 2 is formed at the bottom of the electronic device 2. As the device-side fan 21 is driven, air taken in from the inlet opening 22 flows through the inside of the electronic device 2 as cooling air from bottom to top. An outlet opening (not illustrated) is provided in an upper rear surface of the electronic device 2. The air sent to the electronic device 2 by the device-side fan 21 is discharged to the outside of the electronic device 2 from the outlet opening.

Figure 2:
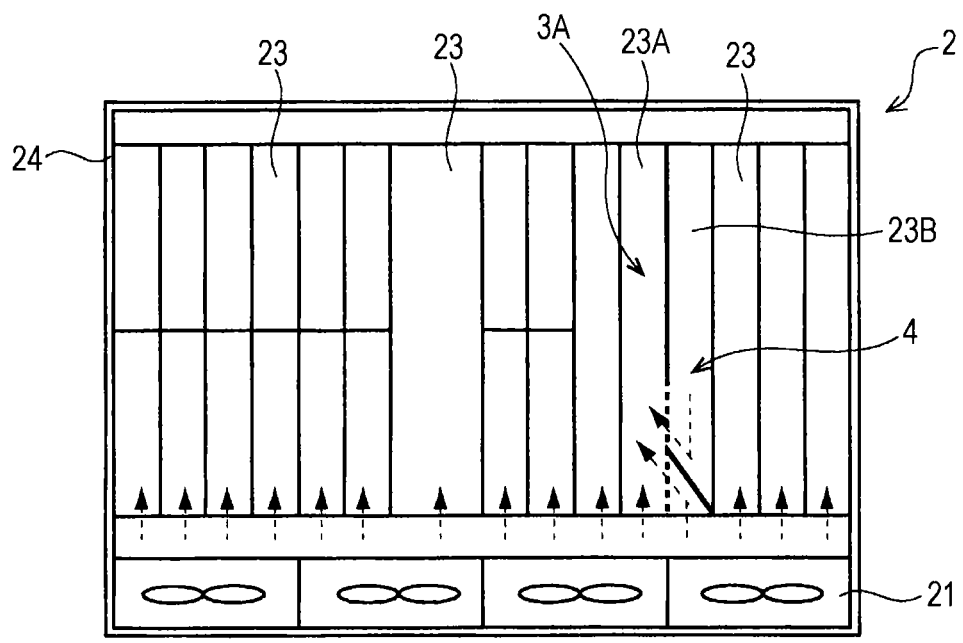
FIG. 2 is a front view schematically illustrating an electronic device according to First embodiment.
Figure 3:
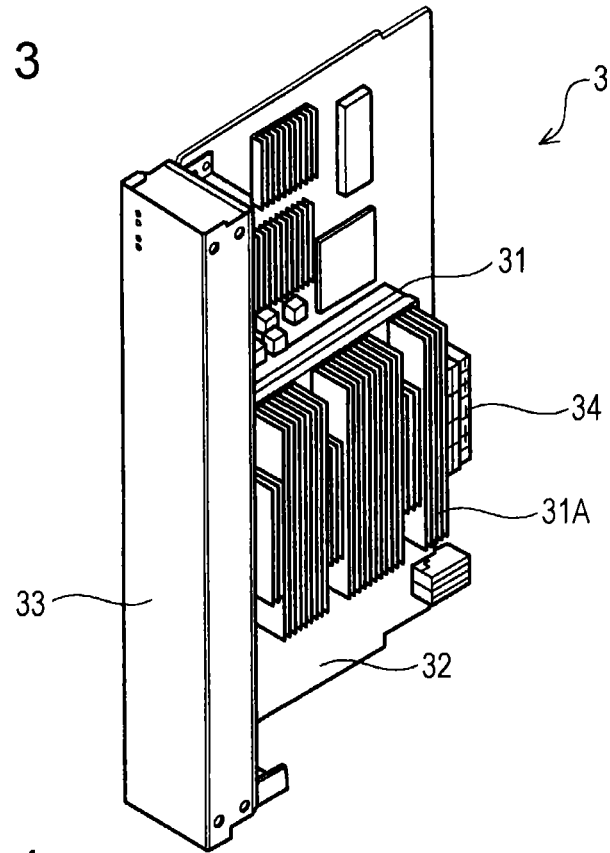
FIG. 3 is a perspective view of a plug-in unit.

FIG. 2 is a front view schematically illustrating the electronic device 2 according to First embodiment. The electronic device 2 includes a shelf 24 provided with a plurality of slots 23. A plug-in unit (hereinafter, referred to as "PIU") 3 illustrated as FIG. 3 is installed into and withdrawn from (placed in and removed from) each of the slots 23 (hereinafter, when referring to each one of the slots 23, this is simply referred to as "the slot 23" unless a distinction is to be made between individual slots 23). The PIU 3 installed in the slot 23 is connected to a connector provided inside the slot 23. Thus, an electronic component on the PIU 3 and the electronic device 2 are electrically connected to each other. In FIG. 2, the PIU 3 is not illustrated. The slot 23 illustrated as FIG. 2 is of a type into which the PIU 3 is installed vertically. While the slots 23 of varying sizes such as full size or half size are depicted in FIG. 2, all of the slots 23 may have the same size. Also, the slots 23 of the shelf 24 are divided from each other by a frame member.

The PIU 3 illustrated as FIG. 3 is an interface card or the like with an electronic component 31 such as an integrated circuit (IC) or a large scale integration circuit (LSI) mounted on a printed circuit board 32. The printed circuit board 32 has substantially a quadrilateral shape, with a front plate portion 33 provided along its one side. A heat sink 31A is placed on top of the electronic component 31. The heat sink 31A includes a plurality of radiator fins made of metal for facilitating dissipation of heat from the electronic component 31 that is a heat generating element.

The front plate portion 33 has such a rectangular shape that conforms to the shape of opening of the slot 23. The PIU 3 is installed into (placed in) the slot 23 with the printed circuit board 32 positioned vertically, and with the front plate portion 33 located toward the front (that is, in such a way that the front plate portion 33 is located on the front side of the electronic device 2). When the PIU 3 is installed in the slot 23, the opening of the slot 23 is closed by the front plate portion 33. Also, a connector 34 is provided at an edge of the printed circuit board 32 opposite to the front plate portion 33. The connector 34 of the PIU 3 is connected by plug-in to a connector on a back wiring board (BWB) side (not illustrated) provided in the shelf 24, for example. The connection between the connectors enables supply of electric power to the electronic component 31 of the PIU 3, and delivery of electrical signals (control signals).

As the temperature inside the electronic device 2 rises with heat generated by the electronic component 31 mounted on the PIU 3, the electronic device 2 activates the device-side fan 21 provided below the slot 23. By activating the device-side fan 21, airflow is produced toward the slot 23. Therefore, the outside air is sent to the slot 23, thereby cooling the electronic component 31 of the PIU 3 installed in the slot 23. The device-side fan 21 may produce airflow toward the slot 23 not by blowing air but by other methods.

Figure 4:
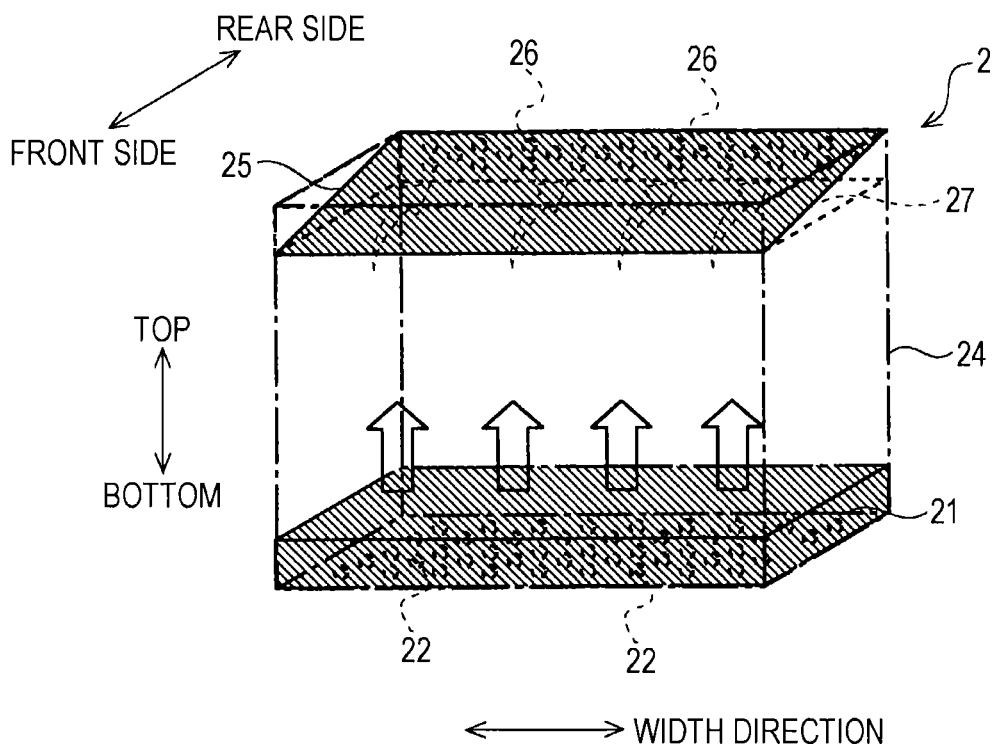
FIG. 4 conceptually illustrates the flow of cooling air blown from a device-side fan.
Figure 5:
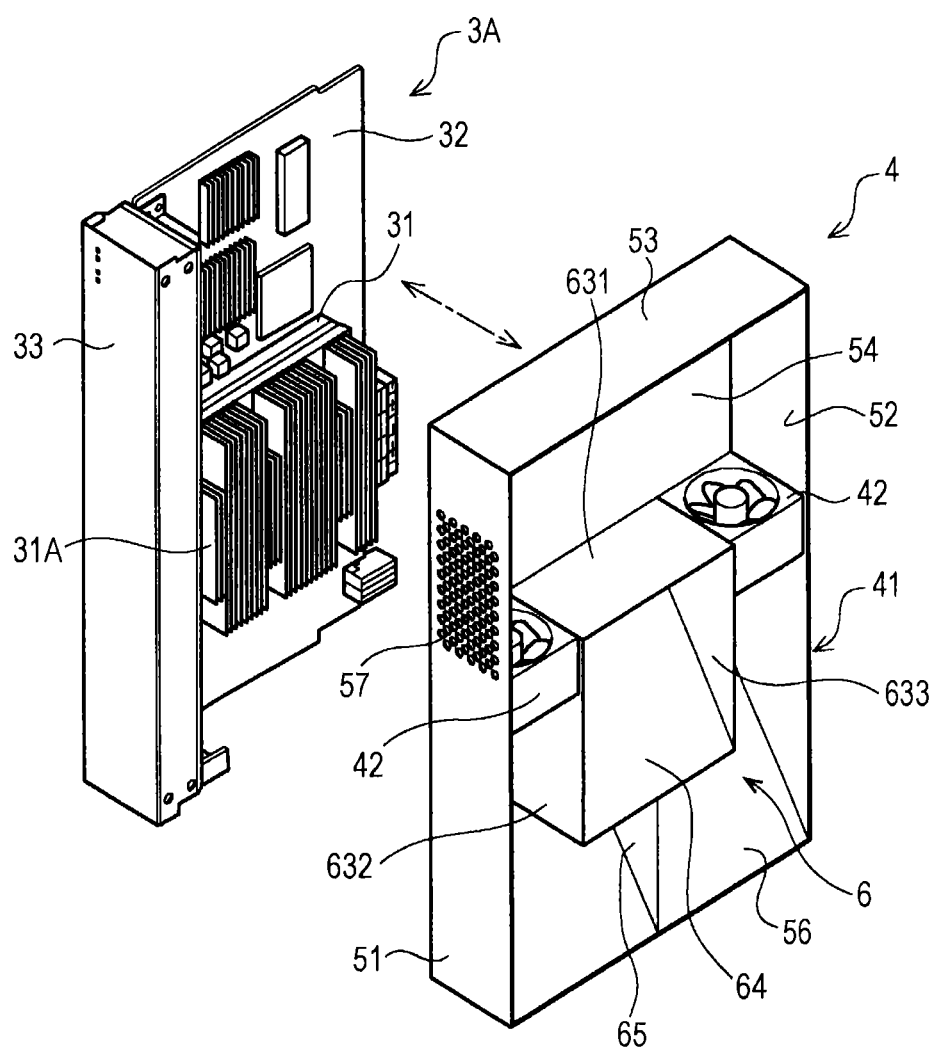
FIG. 5 is a perspective view illustrating the schematic configuration of a cooling unit according to First embodiment.

FIG. 4 conceptually illustrates the flow of air for cooling (indicated by arrows in FIG. 4) blown from the device-side fan 21. Reference numeral 25 in FIG. 4 denotes a top plate of the shelf 24. As illustrated as FIG. 4, the top plate 25 is placed so as to rise obliquely from the front side of the shelf 24 toward the rear side. An outlet opening 26 is formed at the upper side of the rear surface of the shelf 24. Also, an outlet duct 27 is formed in an upper portion of the slot 23. The outlet duct 27 is surrounded by the side and rear surfaces of the shelf 24, and the top plate 25. The outlet duct 27 communicates with the slot 23 and the outlet opening 26. The outlet duct 27 is an example of outlet passage.

When the device-side fan 21 activates, air taken in from the inlet opening 22 formed at the bottom of the electronic device 2 (the shelf 24) is sent out to the slot 23 by the device-side fan 21. The air sent to the slot 23 as cooling air cools the electronic component 31 of the PIU 3 installed in the slot 23. The air that has been warmed by taking away heat from the electronic component 31 flows out from the slot 23 to the outlet duct 27, and passes through the outlet duct 27 to be discharged to the outside from the outlet opening 26. For each one of those slots 23 in which the PIU 3 is not installed, a blocking plate is preferably placed over the slot 23 to block the front opening of the slot 23. Therefore, it is possible to reduce leakage of the air blown from the device-side fan 21 through the front opening of the slot 23 in which the PIU 3 is not installed.

With the recent trend toward higher density, higher speed, and higher power consumption due to the increased number of ports on the electronic device 2 and the increased capabilities of the electronic component 31 mounted on the PIU 3, the amount of heat generated by the electronic component 31 tends to increase. For this reason, there is a possibility that simply blowing air to the slot 23 by using the device-side fan 21 to uniformly cool the PIU 3 may not sufficiently cool the electronic component 31 that generates a large amount of heat. Accordingly, for the type of the PIU 3 on which the electronic component 31 that generates a large amount of heat is mounted, the electronic device 2 according to this embodiment is designed to address this heat generation individually by using a cooling unit 4 in addition to the device-side fan 21. The term port refers to, for example, an interface with an external device connected to the electronic device 2, such as an interface to which an optical fiber is connected.

A plug-in unit to be cooled individually is defined as "target PIU 3A" (see FIG. 2). Of the slots 23 of the electronic device 2, the slot 23 into which the target PIU 3 is to be installed is defined as "first slot 23A", and the slot 23 adjacent to the first slot 23A is defined as "second slot 23B". The electronic device 2 includes the cooling unit 4 that is installed into and withdrawn from (placed in and removed from) the second slot 23B. When installed (placed) in the second slot 23B, the cooling unit 4 individually cools the target PIU 3A. Hereinafter, the cooling unit 4 is described in detail. An example of target PIU is a PIU that consumes a particularly large amount of power, or a PIU including a component that generates a large amount of heat such as an IC or LSI. Also, as the second slot 23B in which to place the cooling unit 4, it is desirable to select a slot that cools the heat-generating component installed in the PIU to be cooled. In a case where the PIU 3 illustrated as FIG. 3 is the target PIU 3 to be cooled, and is installed into the slot 23A illustrated as FIG. 2, the second slot 23B is selected as follows. That is, in this case, it is efficient to cool the heat-generating component installed in the PIU 3 from the right side as viewed from the front. Accordingly, it is preferable to select the slot 23 located on the right side of the slot 23A as the second slot 23B, and place the cooling unit 4 in the selected second slot 23B.

Figure 7:
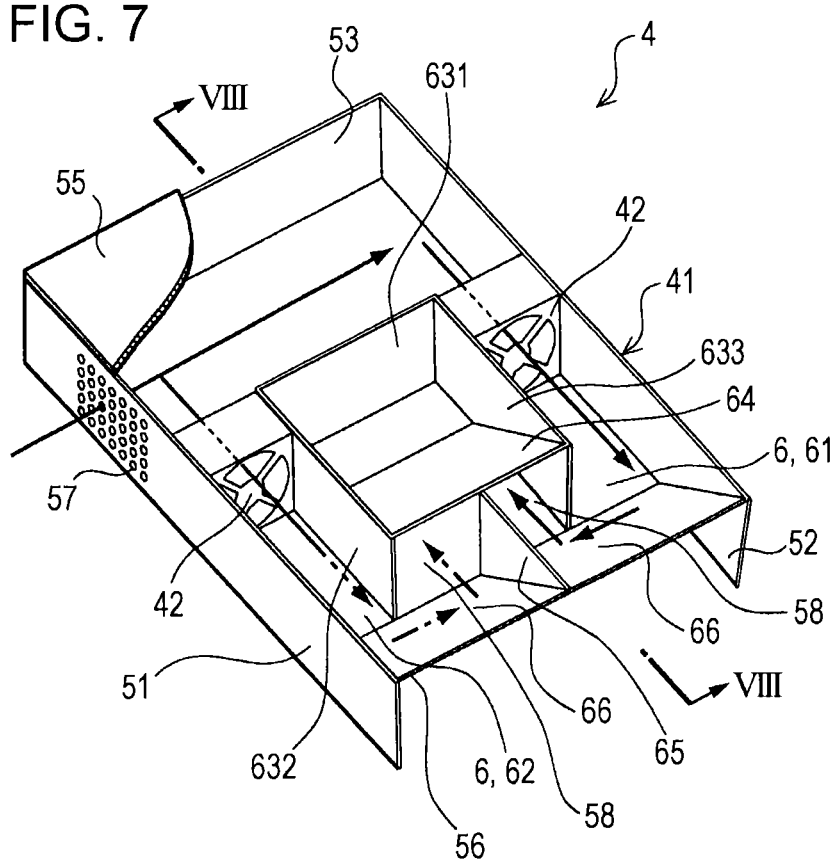
FIG. 7 is a perspective view illustrating the schematic configuration of the cooling unit according to First embodiment.
Figure 8:
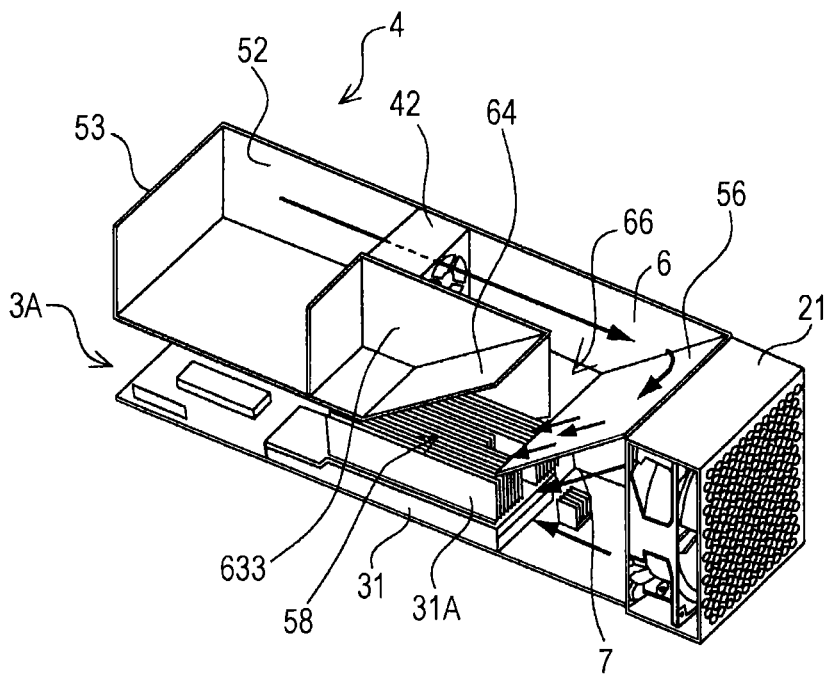
FIG. 8 is a perspective view illustrating the schematic configuration of the cooling unit according to First embodiment.
Figure 9:
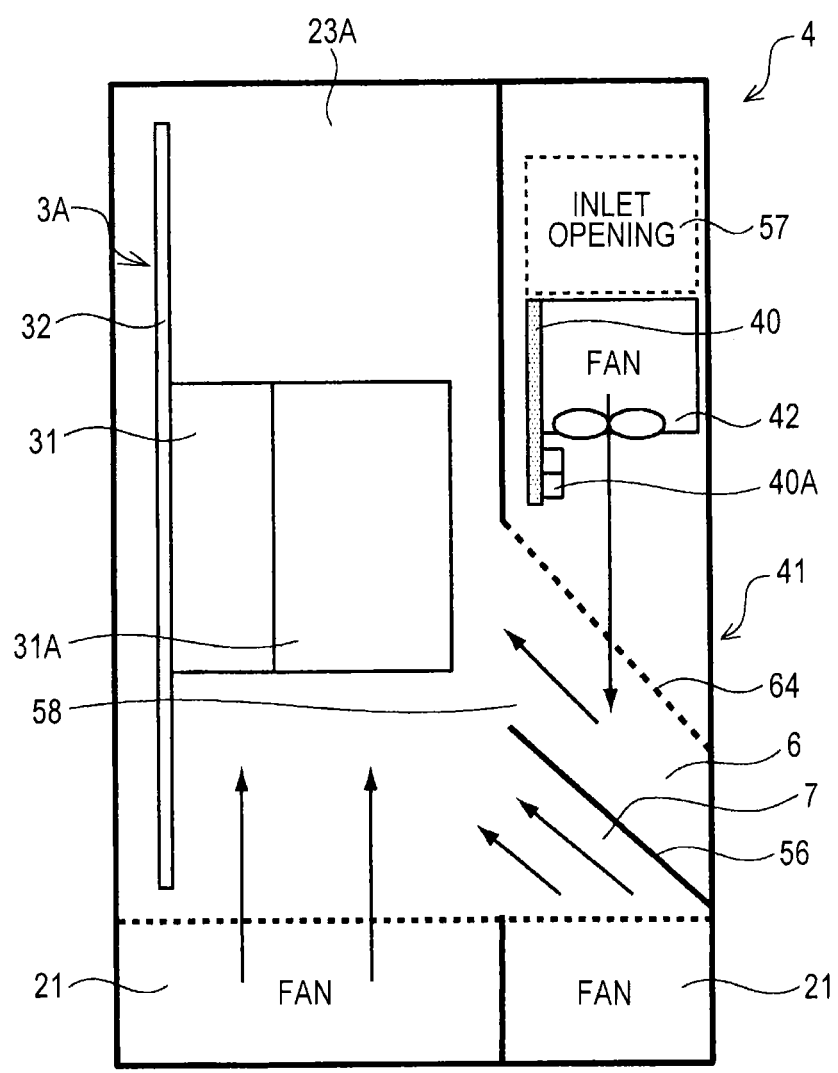
FIG. 9 schematically illustrates the internal structure of the cooling unit according to First embodiment.

FIGS. 5 to 8 are perspective views each illustrating the schematic configuration of the cooling unit 4 according to First embodiment. FIG. 9 schematically illustrates the internal structure of the cooling unit 4. In FIG. 9, the internal structure along the vertical section of the target PIU 3A is illustrated together with the internal structure along the vertical section of the cooling unit 4.

Figure 6:
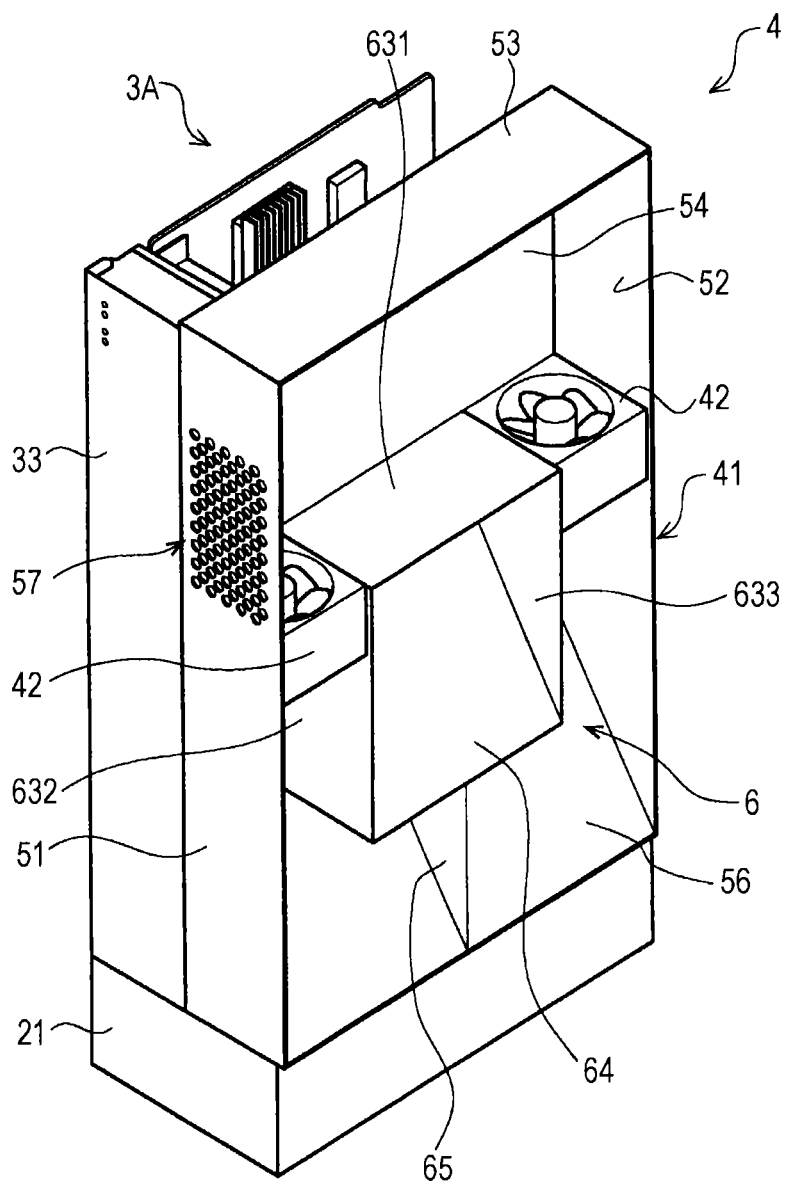
FIG. 6 is a perspective view illustrating the schematic configuration of the cooling unit according to First embodiment.

The cooling unit 4 is a fan unit incorporating (containing) a so-called blower fan. The cooling unit 4 includes a housing 41, and a blower fan (hereinafter, referred to as "unit-side fan") 42 incorporated (contained) inside the housing 41. The unit-side fan is an example of the second fan. FIGS. 6 and 8 also illustrate the target PIU 3A and the device-side fan 21 in addition to the cooling unit 4. FIG. 6 is a perspective view illustrating the arrangement of the cooling unit 4 in relation to the target PIU 3A and the device-side fan 21 when placed in the slot 23B. FIG. 7 is a perspective view of the cooling unit 4 as seen from a perspective different from FIG. 5. In FIG. 7, the flow of air (cooling air) taken into the housing 41 is indicated by solid arrows. FIG. 8 is a perspective sectional view illustrating the section of the cooling unit 4 taken along arrows VIII-VIII illustrated as FIG. 7. As in FIG. 7, arrows illustrated as FIG. 8 also indicate the flow of cooling air in a simulated fashion.

The housing 41 is a box having a generally rectangular parallelepiped outer shape. The housing 41 is placed in and removed from the slot 23. The housing 41 includes a front surface 51, a rear surface 52, a top surface 53, a left side surface 54, a right side surface 55 (which is only partially depicted in FIG. 7 and not depicted in FIGS. 5, 6, and 8), and a division plate 56, which together define the outer shape of the housing 41.

The front surface 51 and rear surface 52 of the housing 41 have such a rectangular shape that conforms to the shape of opening of the slot 23. The cooling unit 4 is placed in the second slot 23B so that the front surface 51 is located toward the front and the rear surface 52 is located toward the back. With the cooling unit 4 placed in the second slot 23B, the front opening of the second slot 23B is blocked by the front surface 51 of the housing 41. Also, an inlet opening 57 for taking (admitting) air into the housing 41 is formed in an upper portion of the front surface 51.

The right side surface 55 (see FIG. 7) of the housing 41 has a rectangular shape. The right side surface 55 has edges connected to the respective edges of the front surface 51, rear surface 52, and top surface 53. A blow opening 58 is formed at substantially the central portion of the left side surface 54. The blow opening 58 opens toward the first slot 23A. The blow opening 58 is an opening for blowing the air (outside air) admitted into the housing 41 from the inlet opening 57 toward a portion of the target PIU 3A that generates a large amount of heat, e.g., the electronic component 31 by using the unit-side fan 42.

Also, as illustrated as FIG. 9, a control printed circuit board 40 is disposed inside the housing 41. The control printed circuit board 40 is arranged in close proximity to the unit-side fan 42, and includes a connector 40A. The connector 40A is a connected to the connector on the back wiring board (not illustrated) provided on the rear side of the shelf 24. Therefore, the drive electric power for the unit-side fan 42 and other control electrical signals or the like are supplied form the shelf 24 side to the control printed circuit board 40.

Next, the division plate 56 is described. The division plate 56 extends obliquely upwards toward the inside of the housing 41, with the bottom end of the right side surface 55 as its proximal end, and its distal end side is connected to the left side surface 54 to define the outer wall surface of the housing 41. The division plate 56 is laid obliquely across between the left and right side surfaces 54 and 55 in such a way that its connecting position with the left side surface 54, which is a side surface in which the blow opening 58 is formed, is located higher than (above) the connecting position with the other side surface, i.e., the right side surface 55. While the function of the division plate 56 is described later in detail, the division plate 56 serves as a guide member that guides the air sent out from the device-side fan 21 located below the housing 41 toward the first slot 23A.

As illustrated as FIGS. 5 to 9, an internal passage 6 is defined inside the housing 41. The internal passage 6 connects the inlet opening 57 and the blow opening 58 with each other. The outside air admitted from the inlet opening 57 is guided to the blow opening 58 by the internal passage 6. The internal passage 6 branches into a first path 61 (the corresponding flow of air is indicated by solid arrows in FIG. 7) and a second path 62 (the corresponding flow of air is indicated by dashed arrows in FIG. 7). The flows of air from the first path 61 and the second path 62 merge near the blow opening 58 after passing a central division wall 65, and the resulting air is blown out toward the target PIU 3A as cooling air from the blow opening 58.

The internal passage 6 is described in more detail. Inside the housing 41, a first partition wall 631, a second partition wall 632, and a third partition wall 633 are provided upright facing the top surface 53, the front surface 51, and the rear surface 52, respectively, at predetermined distances. The first partition wall 631, the second partition wall 632, and the third partition wall 633 are laid across vertically from the left side wall 54 to the right side wall 55. Also, the second partition wall 632 and the third partition wall 633 are parallel to each other, and are both orthogonal to the first partition wall 631. However, the second partition wall 632 and the third partition wall 633 may not be orthogonal to the first partition wall 631. For example, the first partition wall 631, the second partition wall 632, and the third partition wall 633 may be formed as a single contiguous curved wall.

With respect to the top-bottom direction (height direction) of the housing 41, the position of the lower-side (the division plate 56 side) end of each of the second partition wall 632 and third partition wall 633 is flush with the connecting position of the division plate 56 with the left side surface 54. Also, in the internal passage 6 of the housing 41, the unit-side fan 42 is arranged in each of the vertical passage sandwiched between the second partition wall 632 and the front surface 51, and the vertical passage sandwiched between the third partition wall 633 and the rear surface 52.

Further, an oblique top plate 64 is laid across between the second partition wall 632 and the third partition wall 633. More specifically, the oblique top plate 64 is laid across obliquely from the right side surface 55 to the left side surface 54 so as to be substantially in parallel to the division plate 56. The blow opening 58 according to this embodiment is defined by edges at the respective boundaries between the left side surface 54, and the division plate 56, the oblique top plate 64, the second partition wall 632, and the third partition wall 633. Further, near the central portion in the width direction of the division plate 56 (which coincides with the direction of depth of the housing 41), the central division plate 65 extends vertically upright from the division plate 56 to the right side surface 55. Therefore, with the central division wall 65 as the boundary, the area on the left side surface 54 side and the area on the right side surface 55 side of the division plate 56 are partitioned off from one another.

As described above, the internal passage 6 of the cooling unit 4 is defined by the inner wall surfaces of the housing 41, the first partition wall 631, the second partition wall 632, the third partition wall 633, the division plate 56, the oblique top plate 64, and the like. As the unit-side fan 42 activates, air sucked in from the inlet opening 57 flows into the first path 61 and the second path 62 that branch off from one another at a point along the internal passage 6, and flows down toward the division plate 56 through the vertical passages defined along the top-bottom direction of the housing 41.

The air flowing into the first path 61 is guided to the division plate 56 through the vertical passage sandwiched between the rear surface 52 of the housing 41 and the third partition wall 633. Then, upon reaching the division plate 56, the air flowing in the first path 61 changes direction of flow along the inner surface of the division plate 56, and flows toward the central division wall 65. Therefore, the direction of flow of the air in the first path 61 is changed from a downward direction to a lateral direction inside the housing 41. Thereafter, the air flowing in the first path 61 changes direction of flow from the lateral direction to an upward direction along the central division wall 65, and is guided toward the blow opening 58 so as to flow along the division plate 56 from the proximal end side to the distal end side of the division plate 56.

Meanwhile, the air flowing into the second path 62 is guided to the division plate 56 through the vertical passage sandwiched between the front surface 51 of the housing 41 and the second partition wall 632. Then, upon reaching the division plate 56, the air flowing in the second path 62 changes direction of flow along the inner surface of the division plate 56, and flows toward the central division wall 65. Therefore, the direction of flow of the air in the second path 62 is changed from a downward direction to a lateral direction inside the housing 41. Thereafter, the air flowing in the second path 62 changes direction of flow from the lateral direction to an upward direction along the central division wall 65, and is guided toward the blow opening 58 so as to flow along the division plate 56 from the proximal end side to the distal end side of the division plate 56.

In this way, the air sucked into the housing 41 from the inlet opening 57 is guided to the blow opening 58 by passing through either the first path 61 or the second path 62, and is sent out to the outside of the cooling unit 4 from the blow opening 58 as cooling air. As illustrated as FIGS. 8 and 9, the blow opening 58 of the cooling unit 4 installed in the second slot 23B is provided in the side surface directly facing the first slot 23A (located closer to the first slot 23A). In other words, the cooling unit 4 is placed in the second slot 23B so that its side surface provided with the blow opening 58 faces the mounting surface for the electronic component 31 on the printed circuit board 32 of the target PIU 3A. Therefore, the air blown from the unit-side fan 42 is sent out toward the target PIU 3A from the blow opening 58 through the internal passage 6.

The air that blows out as cooling air from the blow opening 58 cools the electronic component 31 by taking away heat from the electronic component 31 mounted on the target PIU 3A. The division plate 56 extends toward the electronic component 31 of the target PIU 3A and the heat sink 31A placed on the electronic component 31. The cooling air from the blow opening 58 is sent out along the division plate 56. By causing the air from the unit-side fan 42 to flow along the surface (inner surface) on the internal passage 6 side, the division plate 56 guides this air to the blow opening 58 while changing the direction of flow of the air toward the first slot 23A. Therefore, the cooling air from the unit-side fan 42 is introduced to the electronic component 31 of the target PIU 3A in a localized (concentrated) manner, thereby increasing the efficiency of cooling of the electronic component 31 mounted on the target PIU 3A.

Also, the cooling air from the blow opening 58 of the cooling unit 4 merges with the cooling air sent from the device-side fan 21 placed below the first slot 23A in which the target PIU 3A is installed, and the resulting airs into the outlet duct 27 and is discharged to the outside from the outlet opening 26. At this time, the outlet opening 26 discharges air that has been warmed by the heat of the electronic component 31 while passing through the slot 23. Consequently, the ambient temperature on the rear side of the electronic device 2 is higher than the ambient temperature on the front side. In this regard, the inlet opening 57 of the cooling unit 4 is provided in the front surface 51 of the housing 41, and thus low-temperature outside air is taken into the housing 41 through the inlet opening 57. Therefore, a further improvement in the efficiency of cooling of the electronic component 31 mounted on the target PIU 3A may be expected.

As illustrated as FIGS. 8 and 9, the division plate 56 extends obliquely upwards toward the inside of the housing 41 from the bottom end of the right side surface 55, and is laid across obliquely between the left and right side surfaces 54 and 55. In this way, the division plate 56 is provided so as to recede upwards from the bottom end of the second slot 23B, thereby avoiding blocking of the blow opening of the device-side fan 21 arranged below the second slot 23B by the housing 41. Therefore, the flow path that guides the cooling air from the device-side fan 21 to the electronic component 31 of the target PIU 3A may be formed in a manner combined with a forward space 7, which is a space located forward of the device-side fan 21 located below the housing 41.

The division plate 56 is arranged in the flow path of the cooling air sent out vertically upwards from the device-side fan 21 toward the second slot 23B. Consequently, as the cooling air from the device-side fan 21 flows along the division plate 56, the direction of flow of the cooling air is changed toward the first slot 23A (the target PIU 3A). That is, the division plate 56 serves as a guide member that guides (introduces) the cooling air flowing from the device-side fan 21 toward the second slot 23B, toward the electronic component 31 of the target PIU 3A installed in the first slot 23A. Therefore, the air blown from the device-side fan 21 arranged below the second slot 23B is used to cool the electronic component 31 mounted on the target PIU 3A in the first slot 23A. Therefore, a sufficient amount of air is secured to cool the electronic component 31 of the target PIU 3A. Therefore, the efficiency of cooling of the electronic component 31 on the target PIU 3A improves, thereby more effectively cooling the electronic component 31.

Also, the division plate 56 guides the cooling air from the unit-side fan 42 to the target PIU 3A by a surface on one side, and guides the air blown from the device-side fan 21 to the target PIU 3A by a surface on the other side. Accordingly, cooling air is introduced to the electronic component 31 of the target PIU 3A in a localized (concentrated) manner, thereby efficiently cooling the electronic component 31. Further, the division plate 56 according to this embodiment allows the cooling air from the unit-side fan 42 and the cooling air from the device-side fan 21 to be guided to the target PIU 3A by a single member. Accordingly, the cooling unit 4 is made compact. Also, the number of parts for manufacturing the cooling unit 4 is reduced, thereby reducing manufacturing cost. In the cooling unit 4, the cooling air from the unit-side fan 42 and the cooling air from the device-side fan 21 may be guided toward the first slot 23A by another member.

Further, the internal passage 6 (the first path 61 and the second path 62) inside the cooling unit 4 has a diversion section 66 that causes the air admitted from the inlet opening 57 along the surface of the division plate 56, thereby re-diverting the direction of flow of air. An example of "re-diverting the direction of flow of air" is changing the direction of flow of air in the internal passage 6 in a U-shape or in a shape obtained by connecting one straight line edge to one edge of the L shape at the right angle.

The inlet opening 57 of the cooling unit 4 is formed at the upper side of the front surface 51 of the housing 41. Thus, the air taken in from the inlet opening 57 flows downward through the internal passage 6. Then, when the air reaches the diversion section 66 including the division plate 56, the flow path of the air is re-diverted to thereby send out the air toward the target PIU 3A. In this way, by re-diverting the direction of flow of the air admitted into the housing 41 in the diversion section 66, the directions of airflow from both the unit-side fan 42 and the device-side fan 21 are aligned while making effective use of the limited space in the housing 41. Therefore, it is possible to reduce interference between the cooling air from the unit-side fan 42 that blows out from the blow opening 58 toward the first slot 23A, and the cooling air from the device-side fan 21 that is guided to the first slot 23A along the division plate 56, and hence the resulting mutual weakening of the two flows of air. A frame member for dividing the slots 23 from each other may not be placed at the boundary between the second slot 23B in which the cooling unit 4 is placed, and the first slot 23A. Therefore, the cooling air guided from the second slot 23B side by the division plate 56 is smoothly guided to the first slot 23A.

<Modifications>

Figure 10:
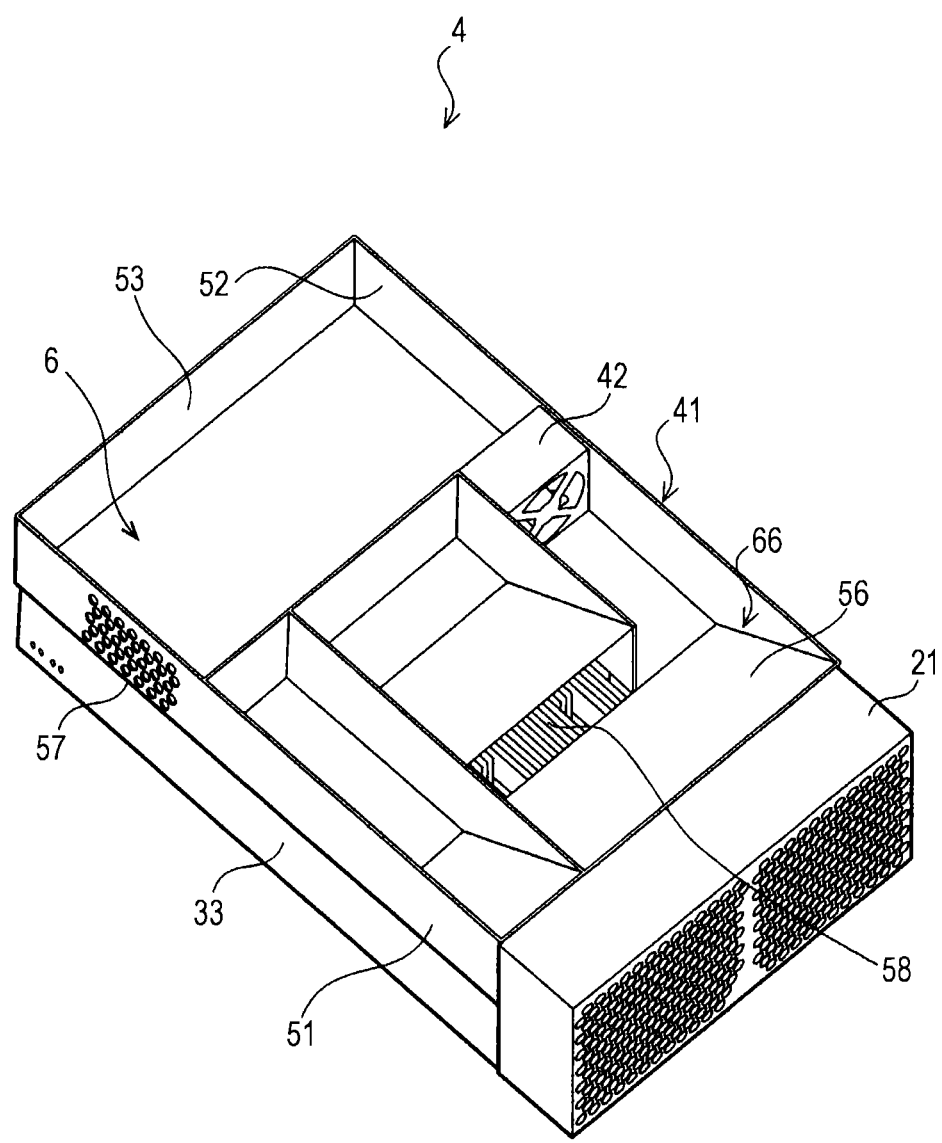
FIG. 10 is a perspective view illustrating a first modification of the cooling unit according to First embodiment.
Figure 11:
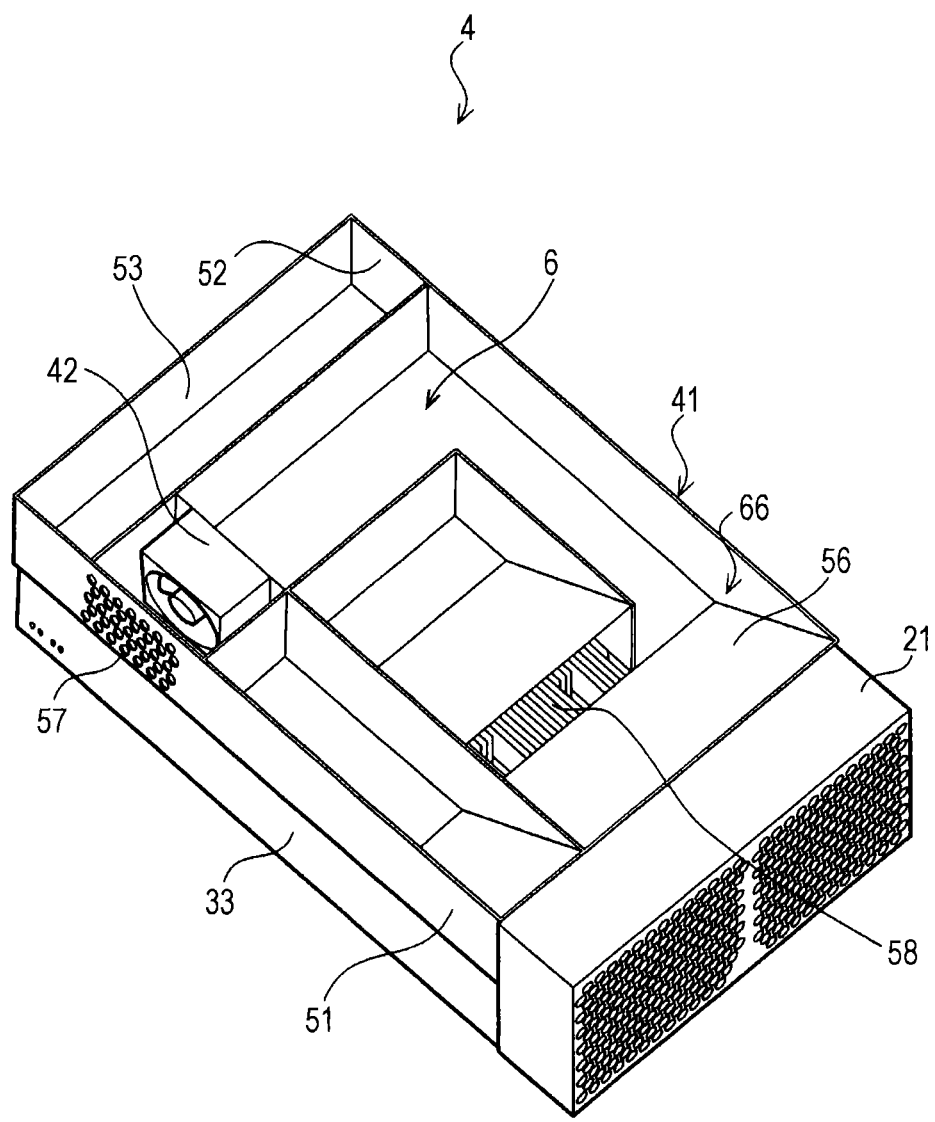
FIG. 11 is a perspective view illustrating a second modification of the cooling unit according to First embodiment.

Next, modifications of the cooling unit 4 are described. FIG. 10 is a perspective view illustrating a first modification of the cooling unit 4. FIG. 11 is a perspective view illustrating a second modification of the cooling unit 4. In FIGS. 10 and 11 as well, one side surface of the cooling unit 4 is not illustrated for the ease of understanding of its internal structure. Specifically, the side surface corresponding to the right side surface 55 illustrated as FIG. 7 according to First embodiment is not illustrated. In the modifications illustrated as FIGS. 10 and 11, structural portions that are the same as those of the cooling unit 4 according to First embodiment are denoted by the same reference numerals to omit a detailed description of those portions. While the foregoing description of the embodiment is directed to the case in which the internal passage 6 branches into the first path 61 and the second path 62, the internal passage 6 may be formed as a single path as illustrated as FIGS. 10 and 11. Also, while the above embodiment is directed to the case in which two unit-side fans 42 corresponding to two paths are incorporated inside the housing 41, the housing 41 may contain a single unit-side fan 42 as illustrated as FIGS. 10 and 11. Of source, depending on the target PIU, the amount of heat generated by the electronic component installed in the PIU, the force of air to be created by the fans, and the like, three or more unit-side fans 42 may be contained inside the housing 41.

According to this embodiment, the following flows of cooling air flow toward the heat sink 31A (radiating part) installed in the target PIU 3A (see arrows in FIG. 9): (1) the cooling air sent to the target PIU 3A directly from below by the device-side fan 21; (2) the cooling air sent to the target PIU 3A from obliquely below by the device-side fan 21 (the cooling air sent obliquely upwards along the division plate 56 from the second slot 23B adjacent to the first slot 23A in which the target PIU 3A is installed); and (3) the cooling air sent to the target PIU 3A from obliquely below by the unit-side fan 42 (the cooling air sent obliquely upwards from the blow opening 58 of the cooling unit 4). These three flows of cooling air merge together from the lower and obliquely lower sides, thereby reducing loss of cooling effect due to a turbulence caused by interference between the flows of cooling air. For example, when cooling air is supplied from below by the device-side fan 21, and cooling air is further supplied from the adjacent slot 23B (i.e., in a lateral direction) to the target PIU 3A, these flows of cooling air cause a turbulence, making it difficult to efficiently cool the target cooling unit 4 efficiently in comparison to this embodiment.

Second Embodiment

Figure 12:
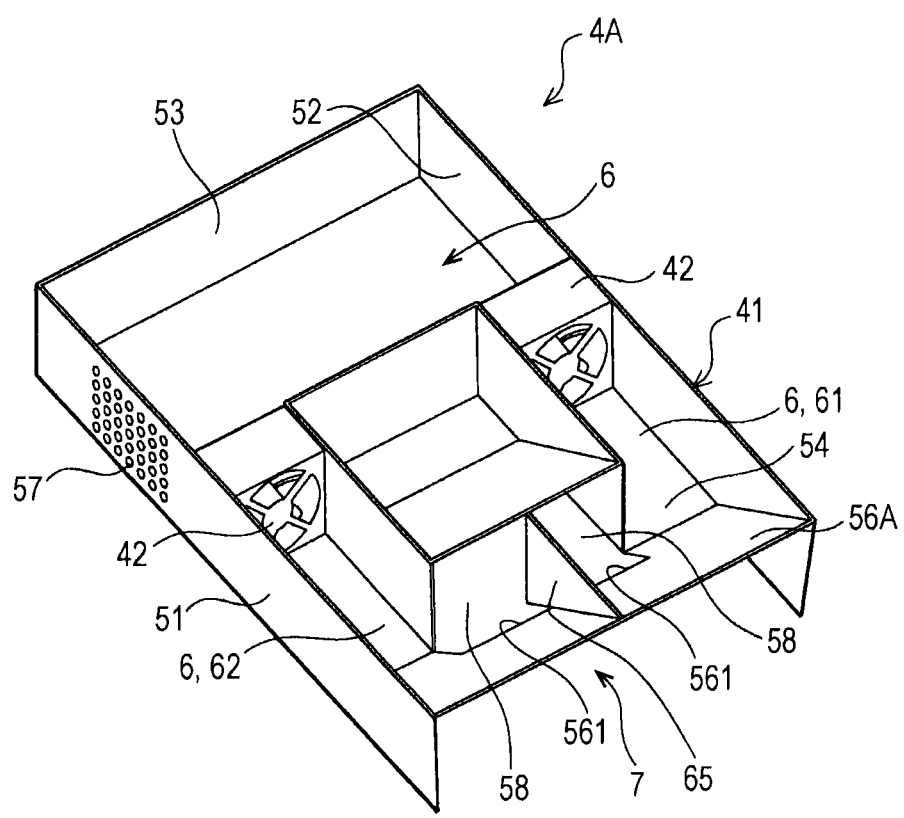
FIG. 12 is a perspective view illustrating the schematic configuration of a cooling unit according to Second embodiment.

Next, the schematic configuration of a cooling unit 4A according to Second embodiment is described. FIG. 12 is a perspective view illustrating the schematic configuration of the cooling unit 4A according to Second embodiment. In the cooling unit 4A, structural portions that are the same as those of the cooling unit 4 according to First embodiment are denoted by the same reference numerals to omit a detailed description of those portions. In FIG. 12, the right side surface of the housing 41 is not illustrated for the ease of understanding of the internal structure of the cooling unit 4A. Specifically, the side surface corresponding to the right side surface 55 illustrated as FIG. 7 according to First embodiment is not illustrated.

The shape of a division plate 56A of the cooling unit 4A differs from that in First embodiment. As illustrated as FIG. 12, the division plate 56A has a cutout recess 561. The cutout recess 561 is formed in a part of the connecting edge of the division plate 56A with the side surface in which the blow opening 58 is formed, that is, the left side surface 54. Therefore, along the width direction of the division plate 56A, the portion of the division plate 56A where the cutout recess 561 is formed has a length shorter than the length of the portion of the division plate 56A where the cutout recess 561 is not formed. The length of the division plate 56A refers to the length along the surface of the division plate 56A from its proximal end to the distal end, the proximal end being defined as the connecting portion of the division plate 56A with the right side surface 55 (not depicted in FIG. 12; see FIG. 7).

The cutout recess 561 forms a part of the blow opening 58. In other words, the blow opening 58 is formed so as to include the cutout recess 561. The flows of cooling air flowing on the inner and outer surface sides of the division plate 56A flow in substantially the same direction. In this way, by forming the cutout recess 561 in the division plate 56A, the flows of cooling air flowing on both the inner and outer surface sides of the division plate 56A, which are each directed toward the electronic component 31 of the target PIU 3A, are sent out to the electronic component 31 while being merged together. Therefore, the velocity of cooling air blown onto the electronic component 31 is increased in comparison to cases where the division plate 56A is not provided with the cutout recess 561. As a result, the efficiency of cooling of the electronic component 31 is improved.

A simulation is conducted under the conditions that the tilt angle of the division plate 56A is 55°, and the length of the portion of the division plate 56A where the cutout recess 561 is formed is two-thirds of the length of the portion where the cutout recess 561 is not formed. The term tilt angle used here refers to the angle made by the division plate 56A with respect to the top surface 53 (horizontal plane) of the housing 41. The results obtained from this simulation indicate that the efficiency of cooling of the electronic component 31 is improved by approximately 10%. While the cutout recess 561 of the division plate 56A forms a part of the blow opening 58 in the example illustrated as FIG. 12, it suffices for the cutout recess 561 to form at least a part of the blow opening 58. Accordingly, for example, the cutout recess 561 and the blow opening 58 may have the same size so that the cutout recess 561 forms the entirety of the blow opening 58.

Third Embodiment

Figure 13:
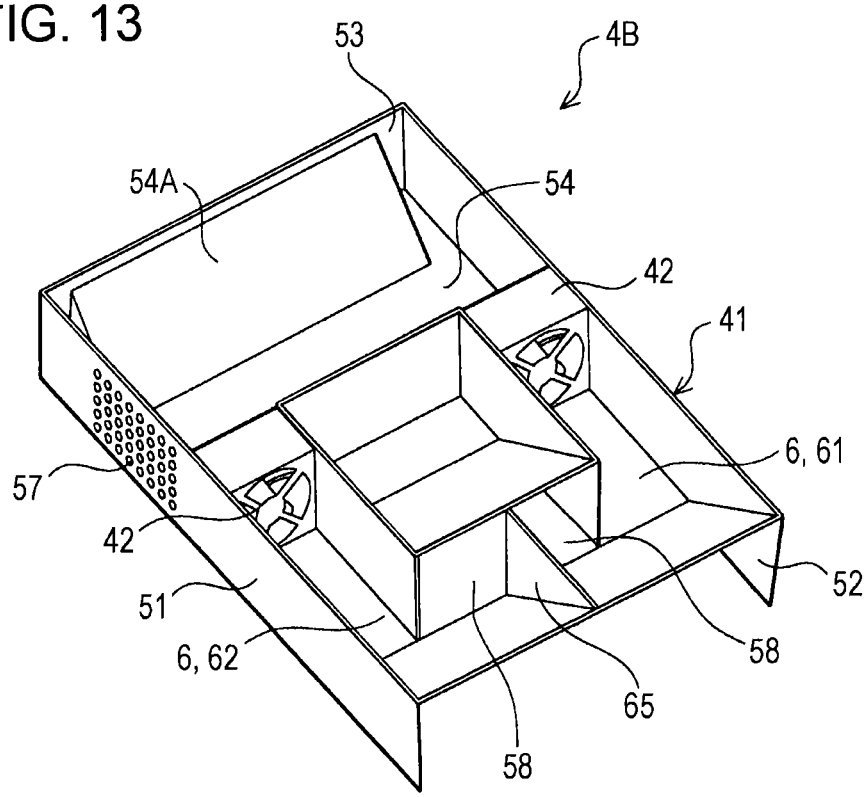
FIG. 13 is a perspective view illustrating the schematic configuration of a cooling unit according to Third embodiment.
Figure 14:
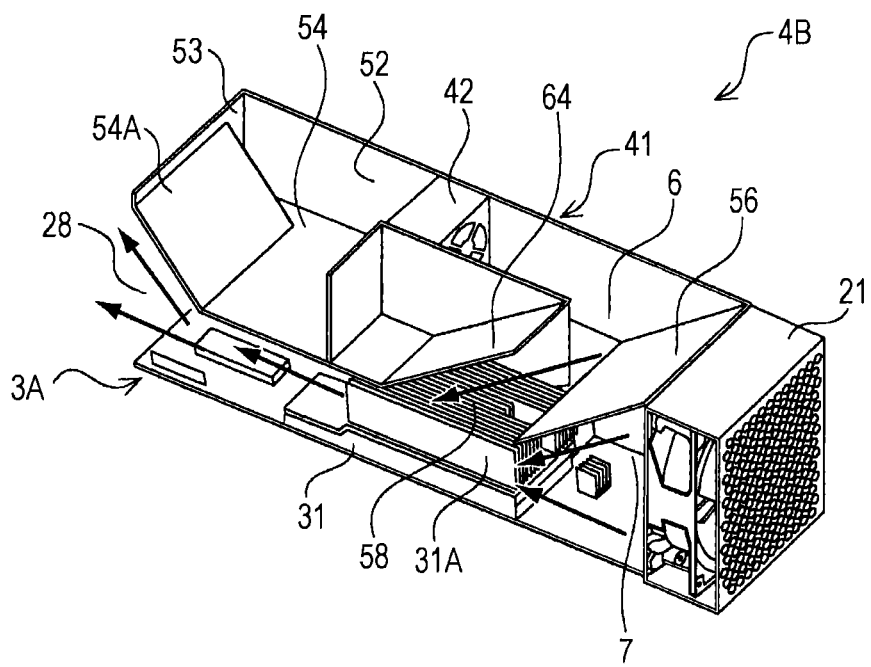
FIG. 14 is a perspective sectional view illustrating the schematic configuration of the cooling unit according to Third embodiment.

Next, the schematic configuration of a cooling unit 4B according to Third embodiment is described. FIG. 13 is a perspective view illustrating the schematic configuration of the cooling unit 4B according to Third embodiment. FIG. 14 is a perspective sectional view illustrating the schematic configuration of the cooling unit 4B according to Third embodiment. In FIG. 14, the target PIU 3A, and the device-side fan 21 are also illustrated. In the cooling unit 4B, structural portions that are the same as those of the cooling unit 4 according to First embodiment are denoted by the same reference numerals to omit a detailed description of those portions. In FIGS. 13 and 14, the right side surface of the housing 41 is not illustrated for the ease of understanding of the internal structure of the cooling unit 4B.

A receding side surface portion 54A is formed at the top end (the end located on the side where the second slot 23B and the outlet duct 27 communicate with each other) of the left side surface 54 provided with the blow opening 58. In the receding side surface portion 54A, the left side surface 54 recedes from the first slot 23A side toward the second slot 23B. The receding side surface portion 54A is formed over a predetermined area from the top end of the left side surface 54. In the portion where the receding side surface portion 54A is formed, the width of the housing 41 is smaller than the width of the second slot 23B. In this way, by providing the receding side surface portion 54A at the top end of the left side surface 54 of the housing 41 facing the first slot 23A, an outlet flow path 28 for guiding the air that has passed through the target PIU 3A to the outlet duct 27 is extended to the second slot 23B side. Therefore, the resistance against the passage of cooling air near the electronic component 31 of the target PIU 3A becomes smaller, thereby increasing the cooling effect for the electronic component 31.

Fourth Embodiment

Figure 15:
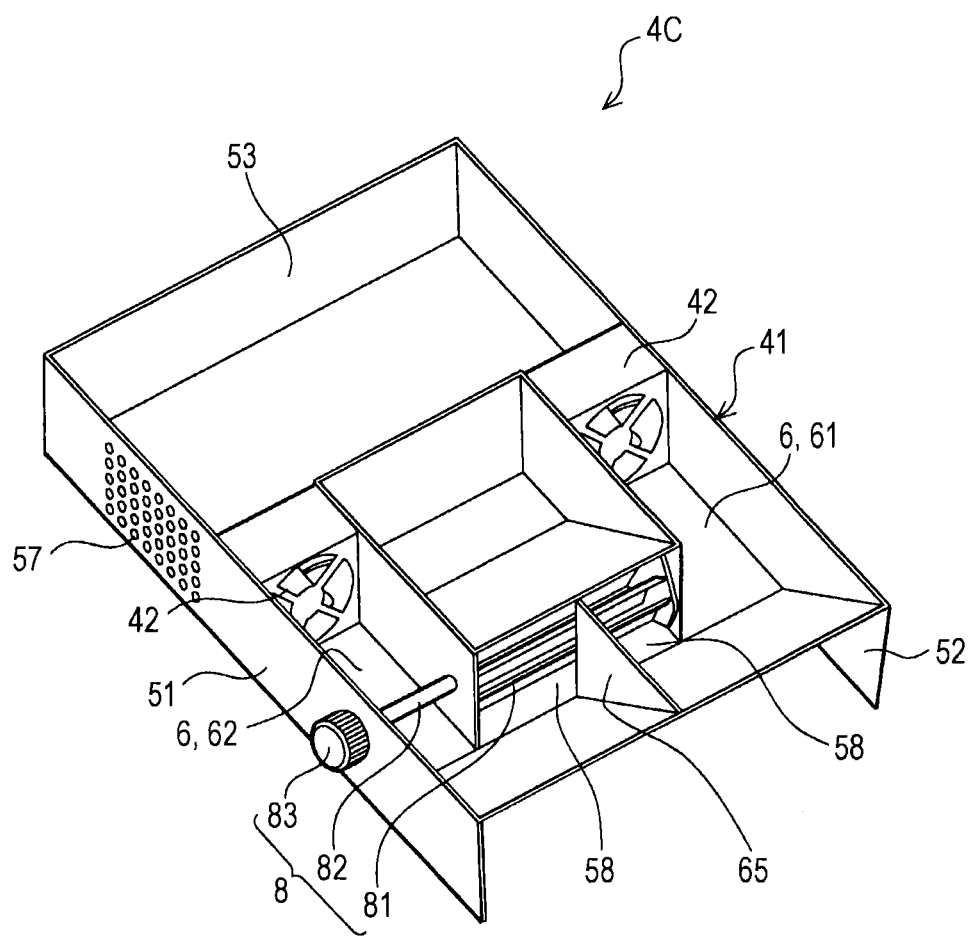
FIG. 15 is a perspective view illustrating the schematic configuration of a cooling unit according to Fourth embodiment.

Next, the schematic configuration of a cooling unit 4C according to Fourth embodiment is described. FIG. 15 is a perspective view illustrating the schematic configuration of the cooling unit 4C according to Fourth embodiment. In the cooling unit 4C, structural portions that are the same as those of the cooling unit 4 according to First embodiment are denoted by the same reference numerals to omit a detailed description of those portions. In FIG. 15, the right side surface of the housing 41 is not illustrated for the ease of understanding of the internal structure of the cooling unit 4C. Specifically, the side surface corresponding to the right side surface 55 illustrated as FIG. 7 according to First embodiment is not illustrated.

The cooling unit 4C includes an air direction changing mechanism 8 that changes the blowing direction of air blowing out from the blow opening 58. The air direction changing mechanism 8 has a plurality of vane members 81 disposed in the blow opening 58, a shaft member 82 that changes the orientation of the vane members 81, and an operating section 83. The vane members 81 define a flow path for air (cooling air) between adjacent ones of the vane members 81. Changing the orientation of the vane members 81 changes the blowing direction of air blowing out from the blow opening 58. The vane members 81 are secured to the shaft member 82 that extends along the depth direction of the housing 41 and is rotatably supported on the housing 41. The distal end of the shaft member 82 protrudes from the front surface 51 so as to extend through the front surface 51 of the housing 41. The operating section 83 is attached at the distal end mentioned above. The operating section 83 is a so-called rotary knob. As the user rotates the operating section 83, the orientation of the vane members 81 is changed, thereby changing the blowing direction of air (cooling air) blowing out from the blow opening 58.

Figure 16A:
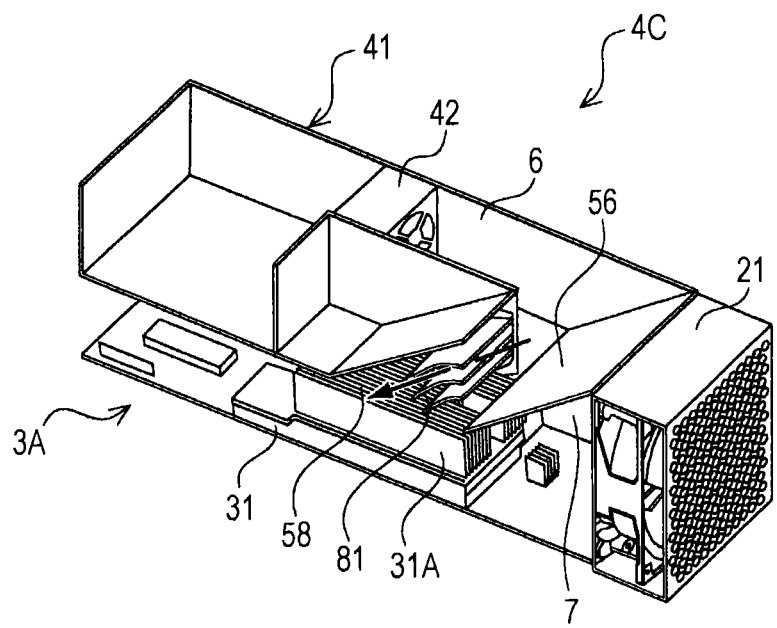
FIG. 16A illustrates operation of vane members of an air direction changing mechanism according to Fourth embodiment.
Figure 16B:
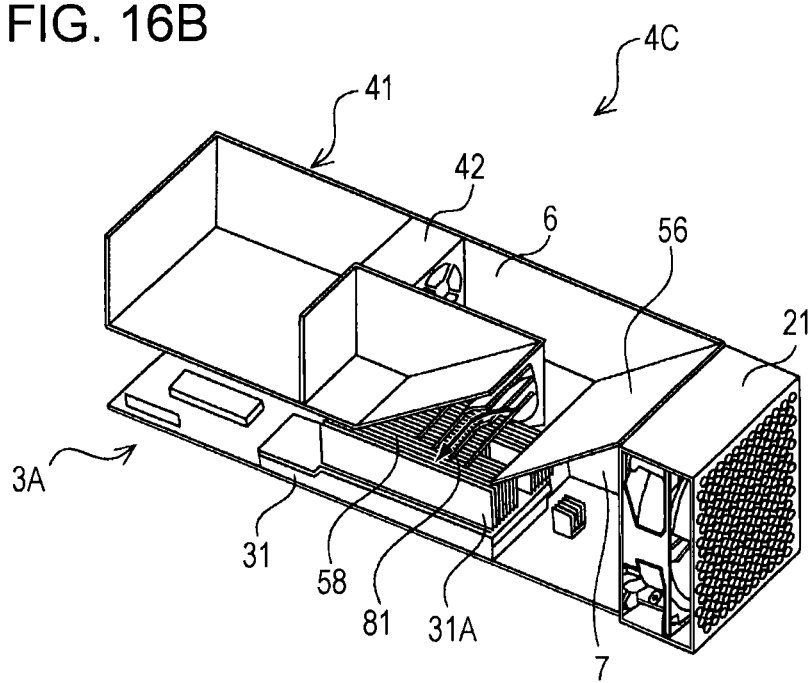
FIG. 16B illustrates operation of the vane members of the air direction changing mechanism according to Fourth embodiment.

FIGS. 16A and 16B each illustrate operation of the vane members 81 of the air direction changing mechanism 8. As illustrated as FIGS. 16A and 16B, by operating the operating section 83, the direction of air that blows out from the blow opening 58 mainly by the unit-side fan 42 is adjusted with respect to the top-bottom direction of the first slot 23A in which the target PIU 3A is installed. Therefore, the blowing direction of cooling air from the blow opening 58 is freely adjusted in accordance with, for example, the location where the electronic component 31 that generates a large amount of heat is mounted on the target PIU 3A. As a result, it is possible to cool the electronic component 31 more efficiently. While in this embodiment the direction of cooling air blowing from the blow opening 58 is adjusted with respect to the top-bottom direction of the first slot 23A in which the target PIU 3A is adjusted, instead of or in combination with this configuration, the direction of cooling air may be adjusted with respect to the left-right direction of the first slot 23A.

Also, while in this embodiment the operating section 83 of the air direction changing mechanism 8 is of a rotary knob type, the operating section 83 to be adopted may be of other types such as a button type. Also, instead of changing the orientation of the vane members 81 through manual operation of the operating section 83, for example, the orientation of the vane members 81 may be changed by electric control. In this case, for example, a plurality of buttons may be arranged on the front surface 51 of the housing 41, and the vane members 81 may be adjusted by electronic control to an orientation corresponding to the button being selected.

The embodiments mentioned above may be implemented in combination with each other as much as possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electric device configured to cool a plurality of plug-in units, the electric device comprising:
    a plurality of slots, each slot configured to install a plug-in unit;
    a first fan configured to create a current of air for cooling the plug-in units;
    a first plug-in unit installed into a first slot; and
    a second plug-in unit including:
        a second fan configured to create a current of air for cooling the first plug-in unit, the second plug-in unit being installed into a second slot adjacent to the first slot, arranged to a side of mounting component of the first plug-in unit;
        a housing configured to include an inlet opening and a blow opening that opens toward the first slot;
        an internal passage configured to be arranged inside the housing, through which air flows from the inlet opening to the blow opening; and
        a guide member configured to guide, toward the first slot, air toward the second slot created by the first fan,
        wherein the second fan is arranged in the internal passage, and configured to flow air from the inlet opening to the blow opening.

2. The electric device according to claim 1, wherein the guide member is a division plate that is laid obliquely across between opposite side surfaces of the housing, the division plate being configured to divide the internal passage and a forward space located forward of the first fan.

3. The electric device according to claim 2, wherein the division plate changes a direction of the current of air created by the second fan toward the first slot so as to guide the current of air to the blow opening.

4. The electric device according to claim 3, wherein the internal passage has a diversion section that causes the current of air created by the second fan to flow along a surface of the division plate to re-divert the direction of the current of air.

5. The electric device according to claim 4, wherein the division plate includes a cutout recess formed in a part of a connecting edge of the division plate with a side surface of the housing in which the blow opening is provided, and the cutout recess forms a part of the blow opening.

6. The electric device according to claim 1, further comprising:
an outlet opening configured to discharge air that has passed through each of the slots, and
an outlet passage opened with one end side of each of the slots, configured to guide a current air to the outlet opening,
wherein the housing further includes a receding side surface portion that is formed at an end of a side surface of the housing in which the blow opening is provided, the end being located on a side where the second slot and the outlet passage communicate with each other, the receding side surface portion being a portion in which the side surface recedes from a side of the first slot toward the second slot.

7. The electric device according to claim 1, wherein the blow opening includes a member configured to change an orientation of the number so as to allow a blowing direction of air from the blow opening to be changed.

8. The electric device according to claim 1, wherein the inlet opening is provided on an upper front of the housing.

9. A cooling unit installed in an electric device including a plurality of slots, a first slot into which a first plug-in unit is installed, and a first fan to create a current of air for cooling the plug-in units, the cooling unit comprising:
a housing installed into a second slot, configured to include an inlet opening and a blow opening that opens toward the first slot;
a second fan configured to create a current of air for cooling the first plug-in unit, the second plug-in unit being installed into a second slot adjacent to the first slot, arranged to a side of mounting component of the first plug-in unit;
an internal passage configured to be arranged inside the housing, through which air flows from the inlet opening to the blow opening; and
a guide member configured to guide, toward the first slot, air toward the second slot created by the first fan,
wherein the second fan is arranged in the internal passage, and configured to flow air from the inlet opening to the blow opening.

10. The electric device according to claim 9, wherein the guide member is a division plate that is laid obliquely across between opposite side surfaces of the housing, the division plate being configured to divide the internal passage and a forward space located forward of the first fan.

11. The electric device according to claim 10, wherein the division plate changes a direction of the current of air created by the second fan toward the first slot so as to guide the current of air to the blow opening.

12. The electric device according to claim 11, wherein the internal passage has a diversion section that causes the current of air created by the second fan to flow along a surface of the division plate to re-divert the direction of the current of air.

13. The electric device according to claim 12, wherein the division plate includes a cutout recess formed in a part of a connecting edge of the division plate with a side surface of the housing in which the blow opening is provided, and the cutout recess forms a part of the blow opening.

14. The electric device according to claim 9, further comprising:
an outlet opening configured to discharge air that has passed through each of the slots, and
an outlet passage opened with one end side of each of the slots, configured to guide a current air to the outlet opening,
wherein the housing further includes a receding side surface portion that is formed at an end of a side surface of the housing in which the blow opening is provided, the end being located on a side where the second slot and the outlet passage communicate with each other, the receding side surface portion being a portion in which the side surface recedes from a side of the first slot toward the second slot.

15. The electric device according to claim 9, wherein the blow opening includes a member configured to change an orientation of the number so as to allow a blowing direction of air from the blow opening to be changed.

16. The electric device according to claim 9, wherein the inlet opening is provided on an upper front of the housing.

17. A housing for a cooling unit, the cooling unit being installed in an electronic device including a plurality of slots, a first slot into which a first plug-in unit is installed, and a first fan to create a current of air for cooling the plug-in units, the cooling unit being installed into a second slot adjacent to the first slot, and including a second fan to create a current of air for cooling the first plug-in unit, the housing comprising:
an inlet opening;
a blow opening configured to open toward the first slot;
an internal passage configured to be arranged inside the housing, through which air flows from the inlet opening to the blow opening; and
a guide member configured to guide, toward the first slot, air toward the second slot created by the first fan,
wherein the second fan is arranged in the internal passage, and configured to flow air from the inlet opening to the blow opening.

* * * * *